(12) United States Patent
Chiou et al.

(10) Patent No.: US 11,104,996 B2
(45) Date of Patent: Aug. 31, 2021

(54) HEATING STAGE AND APPARATUS HAVING THE SAME

(71) Applicant: Taiwan Semiconductor Manufacturing Co., Ltd., Hsinchu (TW)

(72) Inventors: P. Y. Chiou, Tainan (TW); Chih-Chun Huang, Tainan (TW); Ping-Ting Shen, Kaohsiung (TW); L. S. Huang, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/200,650

(22) Filed: Nov. 27, 2018

(65) Prior Publication Data

US 2019/0169748 A1 Jun. 6, 2019

Related U.S. Application Data

(60) Provisional application No. 62/591,156, filed on Nov. 27, 2017.

(51) Int. Cl.
*C23C 16/46* (2006.01)
*H01L 21/67* (2006.01)
(Continued)

(52) U.S. Cl.
CPC .......... *C23C 16/46* (2013.01); *C23C 16/4586* (2013.01); *C23C 16/45565* (2013.01);
(Continued)

(58) Field of Classification Search
CPC ................ C23C 16/46; C23C 16/4586; C23C 16/45565; C23C 16/50; H01L 21/68735;
(Continued)

(56) References Cited

U.S. PATENT DOCUMENTS 6,464,795 B1 * 10/2002 Sherstinsky ...... C23C 16/45521
118/715
6,494,955 B1 12/2002 Lei et al.
(Continued)

FOREIGN PATENT DOCUMENTS

CN 104205295 12/2014
KR 20030021212 3/2003

OTHER PUBLICATIONS

"Office Action of Taiwan Counterpart Application", dated Nov. 26, 2019, with English translation thereof, p. 1-p. 11.
(Continued)

*Primary Examiner* — Ram N Kackar
(74) *Attorney, Agent, or Firm* — JCIPRNET

(57) ABSTRACT

A heating stage includes a pedestal and a thermal-conductive plate. The thermal-conductive plate is located on the pedestal. The thermal-conductive plate has a central portion and an edge portion surrounding the central portion, and the edge portion comprises a first portion and a second portion connected to the first portion, where the first portion is sandwiched between the central portion and the second portion. A height of the second portion gradually decreases along a direction from the central portion toward the edge portion.

20 Claims, 5 Drawing Sheets

(51) Int. Cl.
*C23C 16/458* (2006.01)
*C23C 16/455* (2006.01)
*H01L 21/687* (2006.01)
*C23C 16/50* (2006.01)

(52) U.S. Cl.
CPC .... *H01L 21/67103* (2013.01); *H01L 21/6875* (2013.01); *H01L 21/68735* (2013.01); *C23C 16/50* (2013.01)

(58) Field of Classification Search
CPC ........... H01L 21/6875; H01L 21/67103; H01L 21/67098
USPC .... 118/725, 728, 729, 730, 500; 156/345.52
See application file for complete search history.

(56) References Cited

U.S. PATENT DOCUMENTS

| | | | | |
|---|---|---|---|---|
| 6,730,175 | B2* | 5/2004 | Yudovsky | C23C 16/45521 118/500 |
| 7,060,945 | B2* | 6/2006 | Kondou | H05B 3/143 118/50.1 |
| 2005/0000449 | A1* | 1/2005 | Ishibashi | C30B 25/12 118/728 |
| 2015/0240357 | A1* | 8/2015 | Tachibana | C23C 16/45551 118/725 |
| 2017/0076965 | A1 | 3/2017 | Lee et al. | |

OTHER PUBLICATIONS

"Office Action of China Counterpart Application", dated Jun. 2, 2021, p. 1-p. 10.

* cited by examiner

HEATING STAGE AND APPARATUS HAVING THE SAME

CROSS-REFERENCE TO RELATED APPLICATION

This application claims the priority benefit of U.S. provisional application Ser. No. 62/591,156, filed on Nov. 27, 2017. The entirety of the above-mentioned patent application is hereby incorporated by reference herein and made a part of this specification.

BACKGROUND

Manufacturing a semiconductor integrated circuit (IC) typically involves numerous processing techniques that require elevated wafer temperatures to perform the desired processes, such as chemical vapor deposition (CVD), physical vapor deposition (PVD), dry etching, or other processing techniques. Due to the raising temperature, severe bowing or warping may likely occur, which leads to damages in the processing wafers. Therefore, the improved wafer holding apparatuses are key factors for suppressing such impacts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
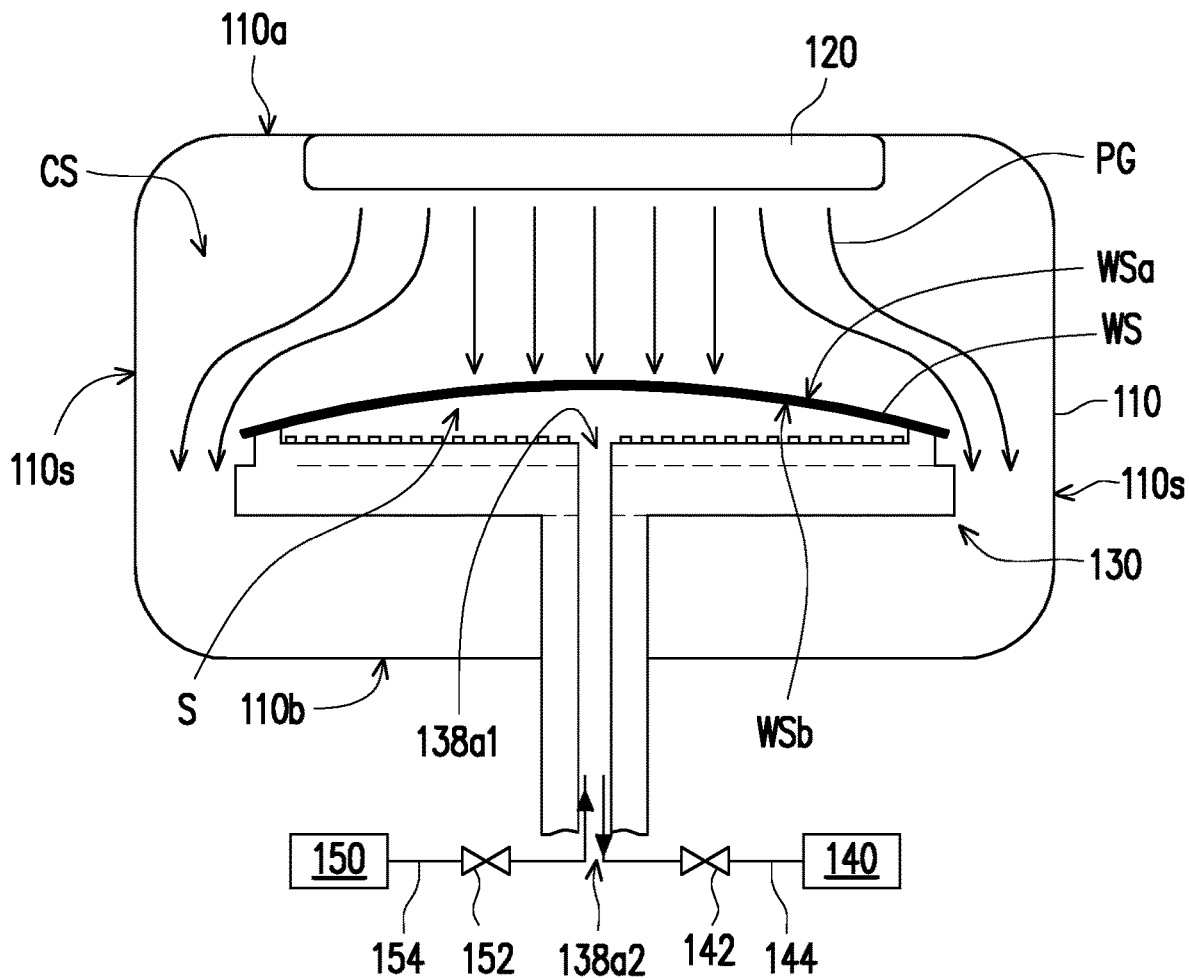
FIG. 1 is a schematic cross-sectional view of an apparatus having a heating stage according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

The disclosure will be described with respect to embodiments in a specific context, namely a heating stage which that realize even temperature distribution in a wafer substrate during processes involving elevated wafer temperature, such as chemical vapor deposition (also referred as CVD), physical vapor deposition (also referred as PVD), atomic layer deposition (also referred as ALD), impurity doping, rapid thermal process (also referred as RTP), anneal, and metal deposition, without damages causing by bowing or warping. The embodiments may be used to heat wafer substrates of various diameter, achieving even temperature distribution across each wafer substrate to perform desired processes while suppress damages causing by bowing or warping effects. It is noted that, although the disclosure has been described in conjunction with specific embodiments, it is to be understood that the disclosure is not limited to these embodiments and many modifications and variations may be made without departing from the scope and spirit of the disclosure as specifically defined in the embodiments. As an example, the embodiments may be used to other semiconductor manufacturing processes, where uniform heat distribution on a semiconductor working piece without damages causing by bowing or warping effects are desired for processing.

Figure 2:
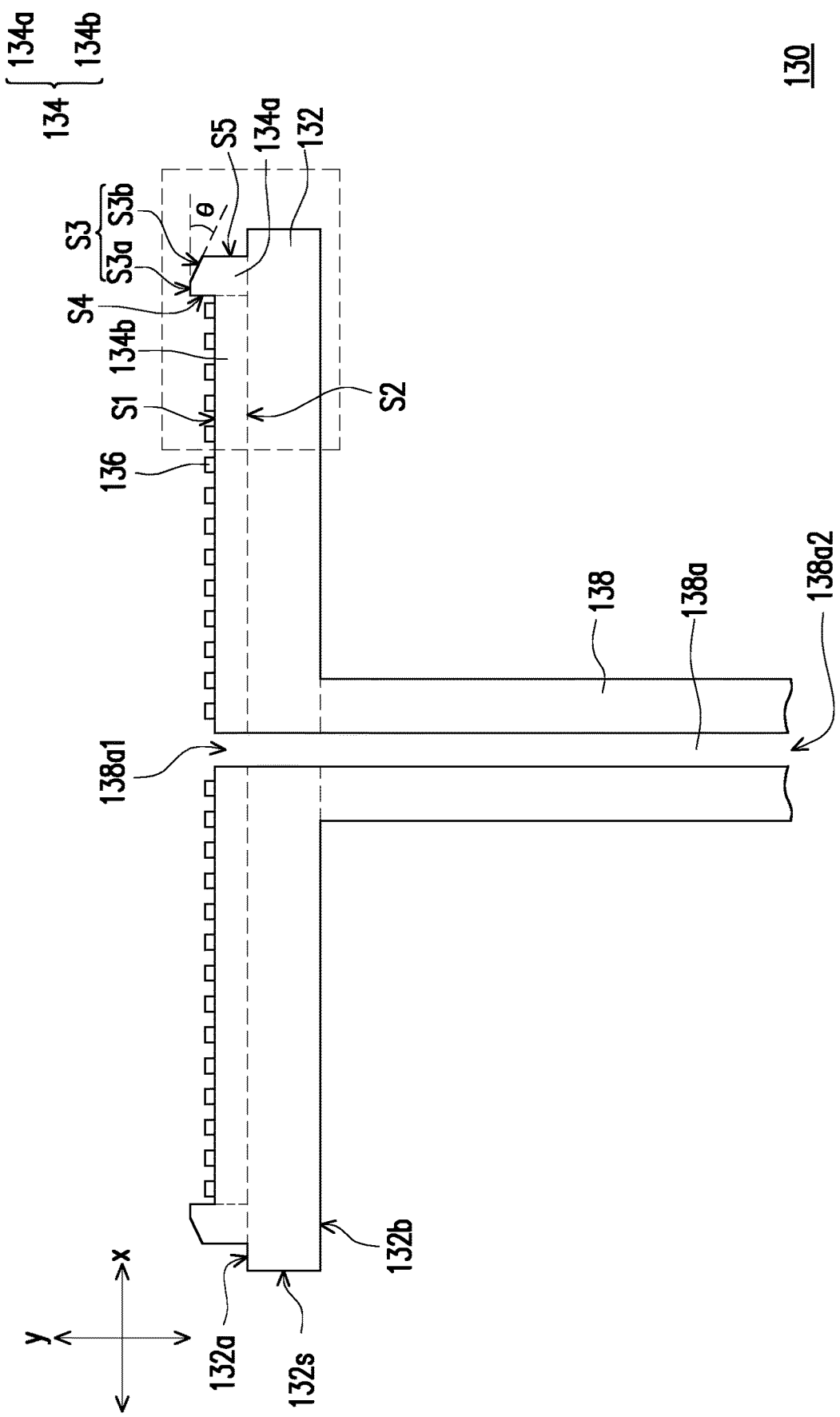
FIG. 2 is a schematic cross-sectional view of a heating stage according to some exemplary embodiments of the present disclosure.
Figure 3:
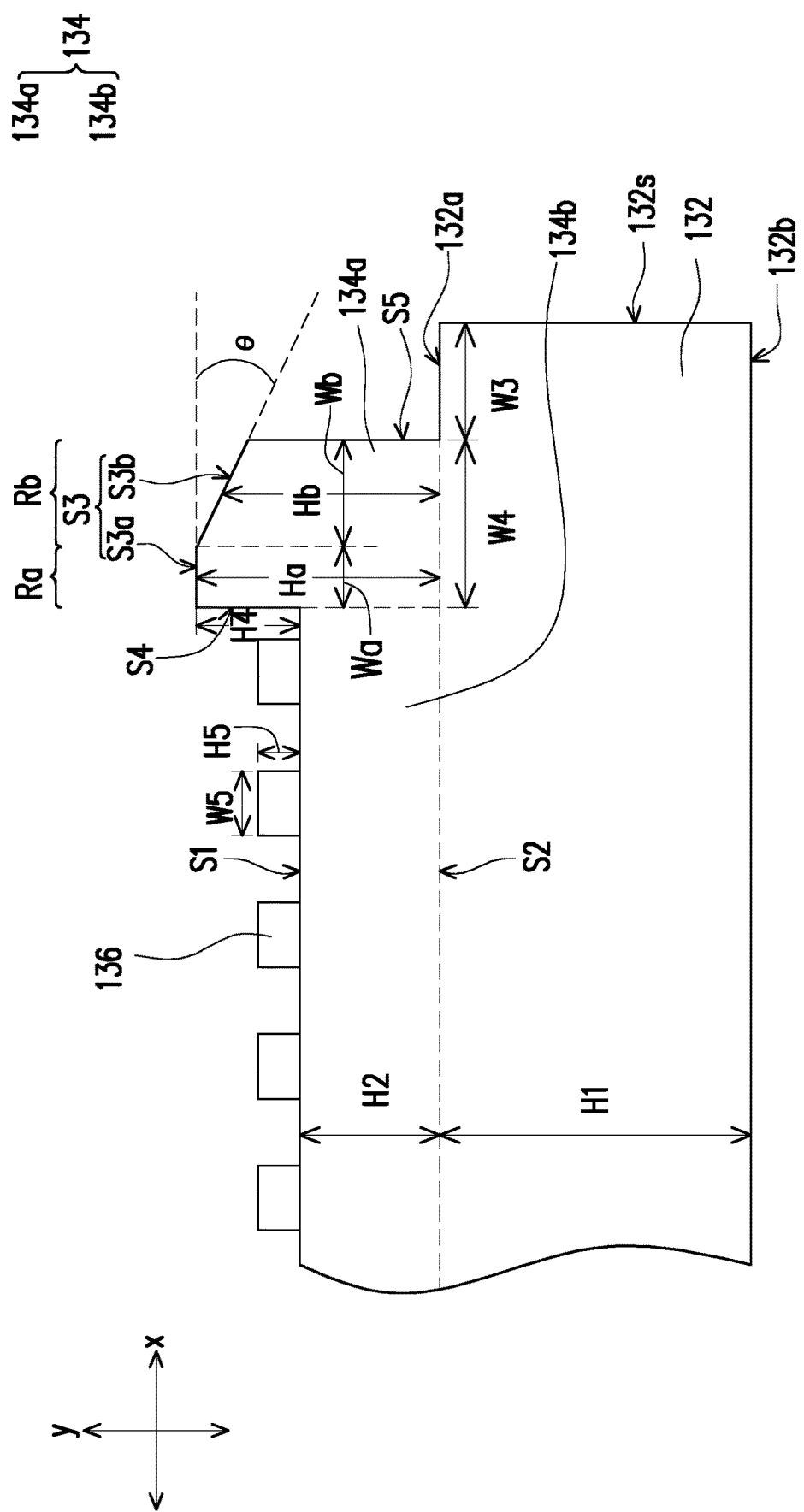
FIG. 3 is an enlarged schematic cross-sectional view of a part of the heating stage depicted in FIG. 2.
Figure 4:
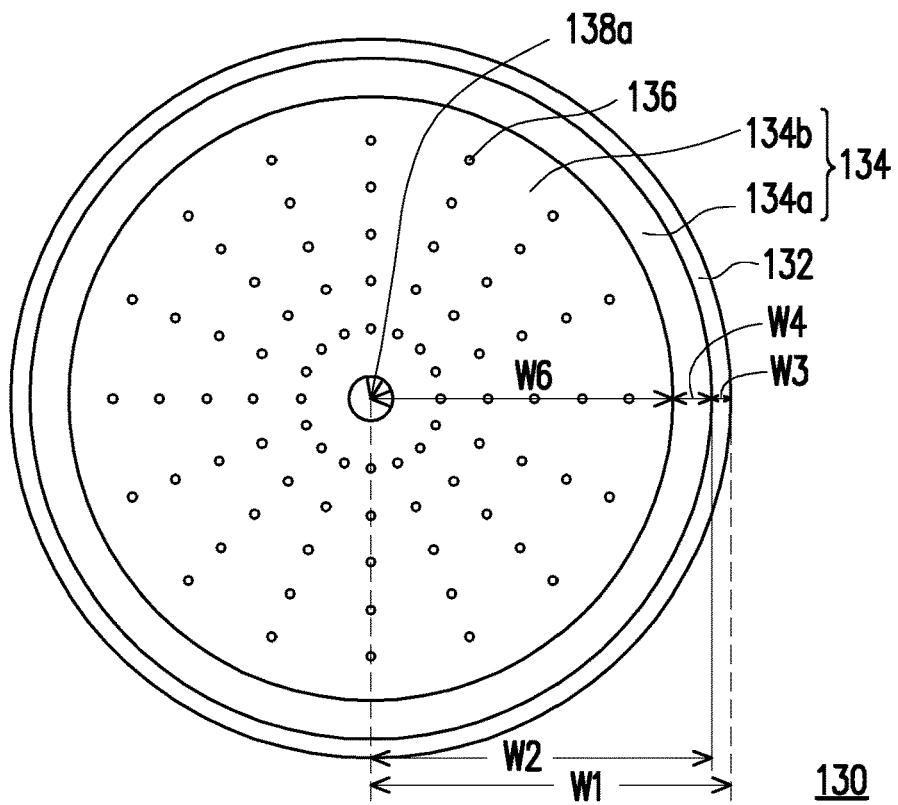
FIG. 4 is a schematic plan view of a heating stage according to some exemplary embodiments of the present disclosure.

FIG. 1 is a schematic cross-sectional view of an apparatus having a heating stage according to some exemplary embodiments of the present disclosure. FIG. 2 is a schematic cross-sectional view of a heating stage according to some exemplary embodiments of the present disclosure. FIG. 3 is an enlarged schematic cross-sectional view of a part of the heating stage depicted in FIG. 2. FIG. 4 is a schematic plan view of a heating stage according to some exemplary embodiments of the present disclosure, where FIG. 4 shows the plan view of the heating stage depicted in FIG. 2. In exemplary embodiments, as shown in FIG. 1 to FIG. 4, a heating stage of the disclosure may be adopted in a CVD chamber, however the disclosure is not limited thereto. In an alternative embodiment, the heating stage of the disclosure may be adopted to a chamber or device performing other process, such as physical vapor deposition, atomic layer deposition, impurity doping, rapid thermal process, anneal, metal deposition, or the like.

Referring to FIG. 1, in some embodiments, a chamber 100 is provided. In some embodiments, the chamber 100 is a material deposition chamber for depositing material layers on a substrate during fabrication of a wafer substrate, and may be used to deposit layers through a deposition process using CVD processes, for example, plasma enhanced chemical vapor deposition (PECVD) or high density plasma chemical vapor deposition (HDP-CVD), in which a gas is flowed over one or more wafer substrates. As shown in FIG. 1, for example, the chamber 100 includes a housing 110, a shower head 120, a heating stage 130, a gas evacuation device 140, and a gas supply device 150.

In some embodiments, during the deposition process, a wafer substrate WS is provided and placed into the chamber 100. For example, as shown in FIG. 1, the wafer substrate WS is positioned and supported by the heating stage 130 through physically contacting a backside surface WSb of the wafer substrate WS and the heating stage 130. In some embodiments, the wafer substrate WS is a doped or undoped silicon wafer or an active layer of a semiconductor-on-insulator (SOI) substrate. In an alternative embodiment, the wafer substrate WS may be a silicon germanium, however the disclosure is not limited thereto. The wafer substrate WS may, for example, include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiment, the wafer substrate WS may be as multi-layered or gradient substrates. In one embodiment, the wafer substrate WS may be a substrate used in the semiconductor device manufacturing industry or used in industries other than semiconductor manufacturing, the disclosure is not limited thereto.

As shown in FIG. 1, in some embodiment, the deposition process includes, but is not limited to, the following steps: placing the wafer substrate WS on the heating stage 130; turning on the gas evacuation device 140 to evacuate the gas in a space S between the wafer substrate WS and the heating stage 130 for holding the wafer substrate WS at the desired location without easily being moved; exhausting a processing gas into the housing 110 through the shower head 120; turning off the gas evacuation device 140 when the pressure applied on the wafer substrate WS by the processing gas being greater enough to maintain a positioning location of the wafer substrate WS; and turning on the gas supply device 150 to exhaust a working gas for ensuring the even temperature distribution of the wafer substrate WS. It is noted that, the deposition process further includes the following steps: heating the wafer substrate WS by the heating stage 130; depositing a film on the wafer substrate WS from the processing gas; and terminating deposition process until a desired height of the film is deposited on the wafer substrate WS. The detailed structures and materials of the housing 110, the shower head 120, the heating stage 130, the gas evacuation device 140, the gas supply device 150, the process gas PG, and the working gas will be elaborated in following descriptions.

As shown in FIG. 1, in some embodiments, the housing 110 includes a top portion 110a, a bottom portion 110b opposite to the top portion 110a, and a sidewall portion 110s connecting the top portion 110a and the bottom portion 110b. In some embodiments, the top portion 110a, the bottom portion 110b and the sidewall portion 110s form an enclosed space CS for accommodating the shower head 120 and the heating stage 130. In some embodiments, a material of the housing 110 includes iron (Fe), chromium (Cr), nickel (Ni), Aluminum (Al), combinations thereof, or the like. The disclosure is not limited thereto.

In one embodiment, the housing 110 is illustrated as being sized to fit a single wafer substrate. However, in certain embodiments, the housing 110 may be large enough to contain more than one wafer substrate during a deposition process. In some embodiments, the housing 110 includes one or more wafer substrate inlets and outlets (not depicted) to allow the insertion and removal of wafer substrates from the enclosed space CS. Alternatively, the housing 110 may include separable portions that can be separated for insertion and removal of wafer substrates and secured together during operation.

As shown in FIG. 1, in some embodiments, the shower head 120 is located in the enclosed space CS and disposed on the top portion 110a of the housing 110. In certain embodiments, the shower head 120, for example, serves as a gas source providing a processing gas PG to be deposited onto the wafer substrate WS, as shown in FIG. 1. In some embodiments, the processing gas PG may be a gas precursor, such as tetrakis(dimethylamino)titanium (TDMAT), for depositing one or more titanium nitride layers. In some embodiments, a material of the shower head 120 includes aluminum (Al) or the like. However, the disclosure is not limited thereto. In one embodiment, more than one processing gases may be supplied through the shower head 120 at the same time or individually. In the disclosure, the material of the processing gases may be designated or selected based on the demand, and is not limited herein.

In addition, the shower head 120, for example, may further supplies a carrier gas (not shown) while supplying the processing gas PG, where the carrier gas is not reacted with the processing gas PG or any materials forming the chamber 100, but only facilitate adjustment of the flowing rate of the processing gas PG. In some embodiments, the carrier gas may be a single gas or a mixture of gases. In one embodiments, the carrier gas may include inert gases, however the disclosure is not limited thereto.

As shown in FIG. 1 to FIG. 4, in some embodiments, the heating stage 130 is at least partially located in the enclosed space CS and disposed over the bottom portion 110b of the housing 110. In certain embodiments, the heating stage 130, for example, serves not only as a support element for holding a positioning location of the wafer substrate WS but also as a heating element for heating the wafer substrate WS. In certain embodiments, one or more than one heating devices (not shown) are embedded in and coupled to the heating stage 130, where the wafer substrate WS may be heated to a predetermined temperature (e.g. 300° C.-400° C.) during the deposition process. The number of the heating device is not limited in the disclosure, and may be designated based on the demand.

In some embodiments, as illustrated in the cross-sectional view depicted in FIG. 1, the heating stage 130 are right underlying the shower head 120, where a positioning location of the heating stage 130 and a positioning location of the shower head 120 are at least partially overlapped with each other. In other words, the shower head 120 are at least partially above the heating stage 130, such that the wafer substrate WS placed on the heating stage 130 is also overlapped with the shower head 120, where such configuration may be considered as a proper location for deposition process. As shown in FIG. 1, in certain embodiments, centers of the shower head 120, the heating stage 130, and the wafer substrate WS are aligned with one another, where a top surface WSa of the wafer substrate WS faces toward the shower head 120, and the backside surface WSb of the wafer substrate WS physically contacting the heating stage 130, such that a temperature of the wafer substrate WS is raised by the heating stage 130, and a film or layer is formed and deposited on the wafer substrate WS from the processing gas provided by the shower head 120.

Referring to FIG. 2 to FIG. 4 together, the heating stage 130 has a pedestal 132, a plate 134, pins 136, a supporting shaft 138, and at least one through pipe 138a. As shown in FIG. 2, in certain embodiments, along a direction Y, the pedestal 132 is sandwiched between the plate 134 and the supporting shaft 138, and the pins 136 are located on top of the plate 134 so that the plate 134 is sandwiched between the pins 136 and the pedestal 132. In some embodiments, the at least one through pipe 138a penetrates through the supporting shaft 138, the pedestal 132 and the conductive plate 134 in an order of from bottom to top. In some embodiments, the heating stage 130 may be made of stainless. In one embodiment, the pedestal 132, the conductive plate 134, the pins 136 and the supporting shaft 138 may be integrally formed, however the disclosure is not limited thereto. In the following embodiments, for a clear illustration purpose, an interface of two elements or portions connected to each other may be indicated by a dotted line; or an element or portion may be divided into two or more different sections by one or more than one dotted lines. In an alternative embodiment, the pedestal 132, the conductive plate 134, the pins 136 and the supporting shaft 138 may be formed individually and then be mechanically assembled to each other.

In some embodiments, as shown in FIG. 2 to FIG. 4, the pedestal 132 has a top surface 132a, a bottom surface 132b opposite to the top surface 132a, and a sidewall 132s connecting the top surface 132a and the bottom surface 132b. In some embodiments, the pedestal 132 is in a circle shape in a plan view depicted in FIG. 4, where the pedestal 132 has a maximum radius W1 measured along a direction X and a height H1 measured along the direction Y, and the direction X is not parallel to the direction Y. The direction X, for example, is substantially perpendicular to the direction Y as shown in FIG. 2. In one embodiment, the maximum radius W1 is approximately in a range of 168 mm to 172 mm. In one embodiment, the height H1 is approximately in a range of 15.6 mm to 15.8 mm. However, in an alternative embodiment, the shape (from the plan view) of the pedestal 132 may be elliptical, oval, or the like or any suitable polygonal shape, the disclosure is not limited thereto.

In some embodiments, referring to FIG. 2 to FIG. 4, the plate 134 is disposed on and mechanically connected to the top surface 132a of the pedestal 132. In certain embodiment, as shown in FIG. 4, a portion of the pedestal 132 is exposed by the plate 134, where the portion of the pedestal 132 exposed by the plate 134 has a width W3 measured along the direction X. In one embodiment, the width W3 of the portion of the pedestal 132 exposed by the plate 134 is approximately in a range of 21 mm to 23 mm. In one embodiment, a ratio of the width W3 to the maximum radius W1 is in a range of about 12.2% to 13.7%. For example, the ratio of the width W3 to the maximum radius W1 is about 13%, however the disclosure is not limited thereto.

In certain embodiments, as shown in FIG. 2 to FIG. 3, the plate 134 has a top surface S1, a bottom surface S2 (which is a plane surface extending from a top surface of the portion of the pedestal 132 exposed by the plate 134 along the direction X) opposite to the top surface S1, a non-planar surface S3 opposite to the bottom surface S2, an inner sidewall S4 connecting the top surface S1 and the non-planar surface S3, and an outer sidewall S5 connecting the non-planar surface S3 and the bottom surface S2. In some embodiments, the non-planar surface S3 includes a planar surface S3a and a planar surface S3b connecting to the planar surface S3a, where the planar surface S3a is substantially parallel to the bottom surface S2, and the planar surface S3b is not parallel to the planar surface S3a. As shown in FIG. 2 and FIG. 3, an angle θ is between an extending plane (indicated as a dotted line) of the planar surface S3a and the planar surface S3b. In some embodiments, the angle θ is an acute angle. In certain embodiments, the angle θ is approximately in a range of 0.1° to 2.0°. For example, the planar surface S3b is a slant surface, as shown in FIG. 2 and FIG. 3.

In some embodiments, as shown in FIG. 2 and FIG. 3, along the direction X, the plate 134 includes a ring-frame portion 134a and a central portion 134b connected to and surrounded by the ring-frame portion 134a. In some embodiments, a shape of the plate 134, for example, corresponds to the shape of the pedestal 132. In certain embodiments, in a plan view depicted in FIG. 4, the plate 134 is in a circle shape, where the plate 134 has a maximum radius W2 and the ring-frame portion 134a has a width W4, measured along the direction X. In one embodiment, the maximum radius W2 (e.g., W2=W1−W3) is approximately in a range of 145 mm to 151 mm. In one embodiment, the width W4 is approximately in a range of 6.3 mm to 6.5 mm. In one embodiment, a ratio of the width W4 to the maximum radius W2 is in a range of about 4.2% to about 4.5%. For example, the ratio of the width W4 to the maximum radius W2 may be 4.3%, the disclosure is not limited thereto. As shown in FIG. 3 and FIG. 4, the central portion 134b has a width W6 (e.g. W6=W2−W4) measured along the direction X and a height H2 measured along the direction Y. In one embodiment, the height H2 is approximately in a range of 9.6 mm to 9.9 mm.

Continued on FIG. 2 and FIG. 3, in some embodiments, the ring-frame portion 134a includes a portion Ra and a portion Rb, where the portion Ra corresponds to the planar surface S3a, and the portion Rb corresponds to the planar surface S3b. In certain embodiments, the portion Ra of the ring-frame portion 134a is located between the portion Rb of the ring-frame portion 134a and the central portion 134b along the direction X. As shown in FIG. 2 and FIG. 3, along the direction X, the portion Ra has a width Wa and the portion Rb has a width Wb, wherein the width Wa is less than the width Wb. In some embodiments, the width Wa is in a range of about 2.34 mm to about 2.36 mm. In some embodiments, the width Wb is in a range of about 3.9 mm to about 4.1 mm. In one embodiment, a ratio of the width Wa to the width Wb is in a range of about 57.1% to about 60.5%. For example, the ratio of the width Wa to the width Wb may be about 60%, however the disclosure is not limited thereto. Owing to configuration of the non-planar surface S3, for each wafer substrate WS that is bowed during the deposition, a contact area between the edge of the wafer substrate WS and the ring-frame portion 134a physically contacting thereto is increased, and thus the stress received by the edge of the wafer substrate WS is decreased correspondingly, thereby efficiently avoiding damages causing by bowing or warping effects.

Continued on FIG. 3, the portion Ra corresponding to the planar surface S3a has a height Ha measured along the direction Y, and the portion Rb corresponding to the planar surface S3b has a height Hb measured along the direction Y, where the height Ha is constant while the height Hb gradually decreases along the direction X from the inner surface S4 to the outer surface S5, and the height Ha is substantially equal to a maximum of the height Hb. In some embodiments, a height difference (Hb−H2) between the height Hb and the height H2 is in a range of about 0.3 mm to about 0.6 mm. In some embodiment, along the direction Y, a height difference H4 between the planar surface S3a and the top surface S1 is approximately in a range of 0.4 mm to 0.6 mm. In other words, a height of the inner sidewall S4 is the height difference H4 between the planar surface S3a and the top surface S1.

Figure 5:
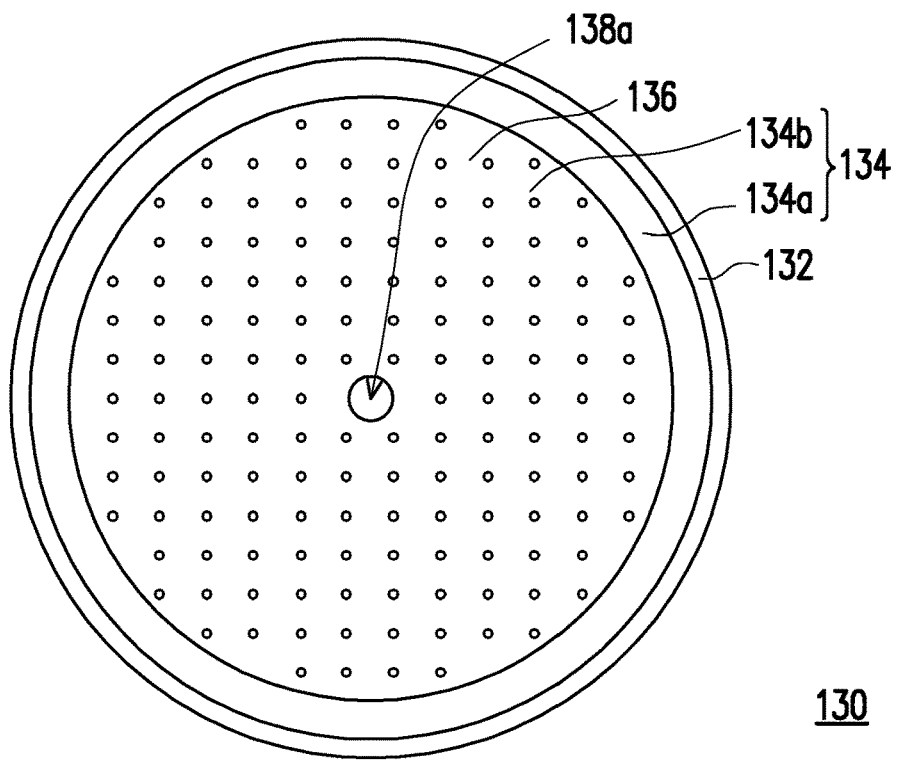
FIG. 5 is a schematic plan view of a heating stage according to some exemplary embodiments of the present disclosure.
Figure 6:
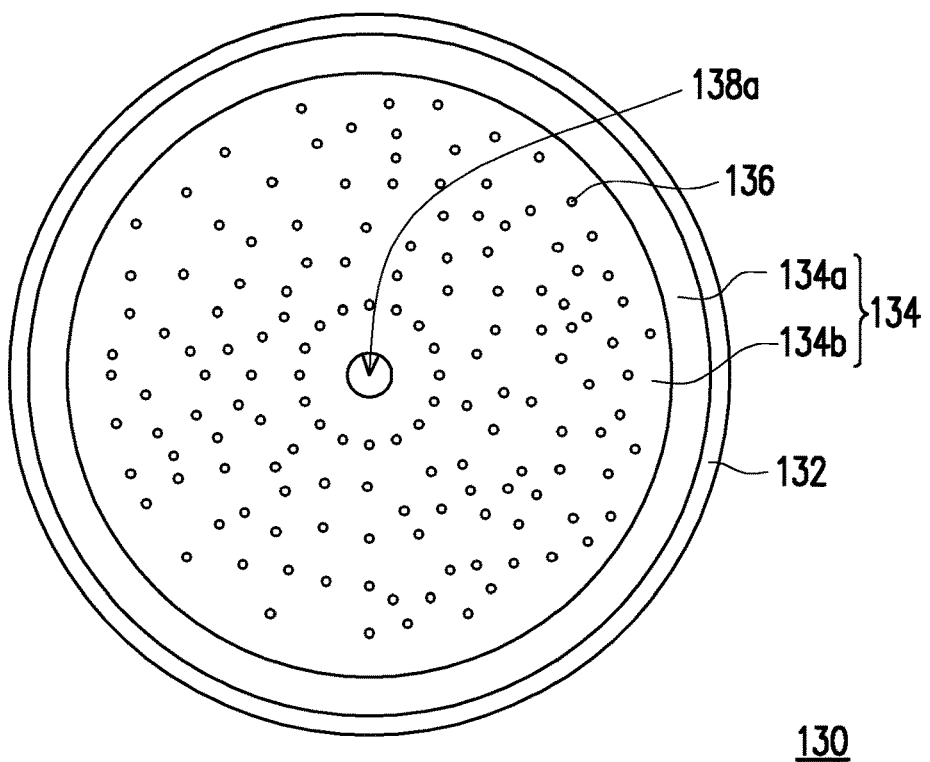
FIG. 6 is a schematic plan view of a heating stage according to some exemplary embodiments of the present disclosure.

In some embodiments, as shown in FIG. 2 to FIG. 4, the pins 136 are disposed on the top surface S1 of the plate 134. A material of the pins 136 may, for example, be the same as the material of the pedestal 132, the material of the plate 134, and/or the material of the supporting shaft 138. In some embodiments, each of the pins 136 has a width W5 measured along the direction X and a height H5 measured along the direction Y. In some embodiments, the width W5 is in a range of about 2.0 mm to about 3.0 mm. In some embodiments, the height H5 is in a range of about 0.3 mm to about 0.6 mm. As shown in FIG. 3, the height H5 is less than the height difference H4 between the planar surface S3a and the top surface S1. In some embodiments, the pins 136 are even distributed over the plate 134, where the pins 136 are physically away from each other by a constant distance there-between. In certain embodiments, the pins 136 are arranged into a pre-determined pattern, such as a concentric arrangement with using the through pipe 138a as the center, see FIG. 4. In an alternative embodiment, the pins 136 may be arranged into a pre-determined pattern, such as a matrix arrangement, as shown in FIG. 5. However, the disclosure is not limited thereto. In one embodiments, the pins 136 are randomly distributed over the plate 134, where the pins 136 are physically away from one another by different distances there-between, as shown in FIG. 6. The size, shape, spacing and arrangement of the pins 136 are not limited herein, and may be modified or selected based on the demand.

Figure 7:
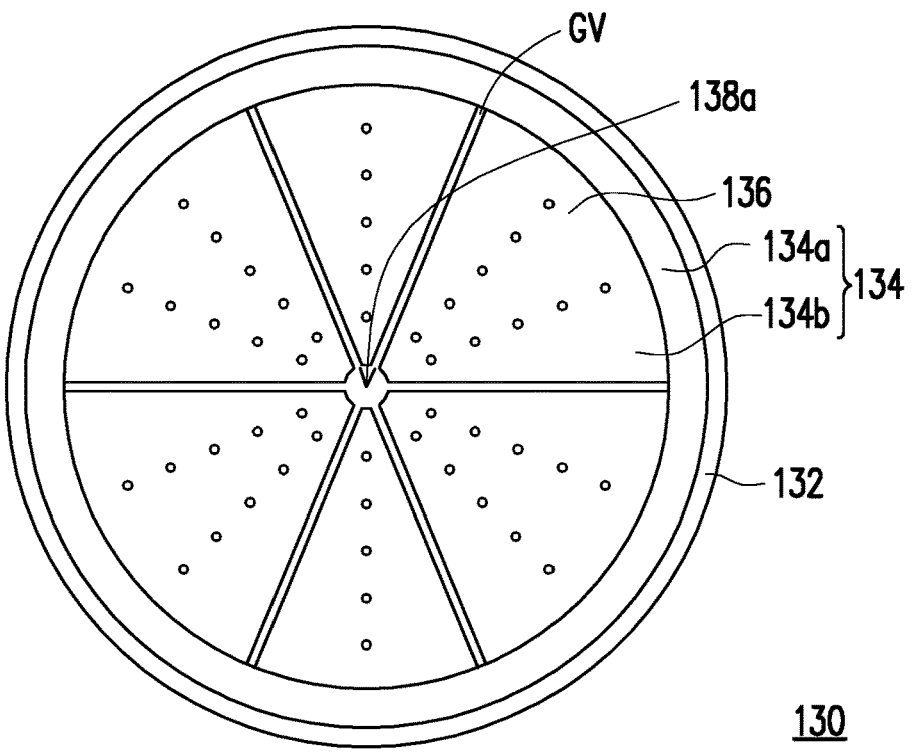
FIG. 7 is a schematic plan view of a heating stage according to some exemplary embodiments of the present disclosure.

In an alternative embodiment, the heating stage 130 further includes a plurality of grooves GV on the plate 134, as shown in FIG. 7. In some embodiments, the grooves GV penetrate a portion of the plate 134 along the direction Y and spatially communicate with the through pipe 138a. In one embodiment, the grooves GV may extend from the through pipe 138a to the ring-frame portion 134a.

In some embodiments, as shown in FIG. 1 and FIG. 2, a portion of the supporting shaft 138 is located inside the housing 110 and other portion of the supporting shaft 138 is located outside the housing 110. In an alternative embodiment, the supporting shaft 138 may be entirely located inside the housing 110. In one embodiment, the supporting shaft 138 may be entirely located outside the housing 110. However, the disclosure is not limited thereto. In some embodiments, the supporting shaft 138 may be coupled to a rotary mechanism (not shown), and the pedestal 132 may be rotated by the supporting shaft 138, thereby obtaining a much more uniform film over the wafer substrate WS.

As shown in FIG. 1 and FIG. 2, a first-end opening 138a1 of the through pipe 138a is at a top surface S1 of the plate 134 and spatially communicated with the enclosed space CS, and a second-end opening 138a2 of the through pipe 138a is at a distal end of the supporting shaft 138 from the pedestal 132 and connected to the gas evacuation device 140 and the gas supply device 150.

In some embodiments, the gas evacuation device 140 is mechanically connected to the through pipe 138a embedded in the supporting shaft 138 through a tube 144, as shown in FIG. 1. In some embodiments, the gas evacuation device 140 may include a vacuum pump. In some embodiments, the gas evacuation device 140 is used to evacuated gas from a space S formed between the wafer substrate WS and the heating stage 130 to hold the wafer substrate WS at a desired positioning location (e.g. the proper location for deposition process as mentioned above), the disclosure is not limited thereto. In one embodiment, the gas evacuation device 140 may also be used to evacuated gas (e.g. processing gas PG) from the enclosed space CS of the housing 110. The number of the gas evacuation device 140 and the tube 144 may be varies based on the demand.

In some embodiments, the gas supply device 150 is mechanically connected to the through pipe 138a embedded in the supporting shaft 138 through a tube 154, as shown in FIG. 1. In some embodiments, the gas supply device 150 supplies a working gas into the space S formed between the wafer substrate WS and the heating stage 130 through the tube 154 and the through pipe 138a; and owing to that, the working gas improves the uniformness of a temperature distribution of the wafer substrate WS during the deposition process. In one embodiment, the working gas may be argon, however the disclosure is not limited thereto. In some embodiments, the gas supply device 150 may supply other suitable gas(es), which has no reactive to the wafer substrate WS, the heating stage 130, the shower head 120, the housing 110, or the processing gas PG, such as inert gases. The number of the gas supply device 150 and the tube 154 may be varies based on the demand.

In certain embodiments, as shown in FIG. 1, the chamber 100 further includes a plurality of valves 142 and 152 to control the gas evacuation device 140 and the gas supply device 150 respectively, so that the amount and/or flowing rate of the working gas being input or evacuated from the space S are controllable. In one embodiments, the valves 142 and 152 can be remotely controlled by a controller (not shown).

According to some embodiments, a heating stage includes a pedestal and a thermal-conductive plate. The thermal-conductive plate is located on the pedestal. The thermal-conductive plate has a central portion and an edge portion surrounding the central portion, and the edge portion includes a first portion and a second portion connected to the first portion, where the first portion is sandwiched between the central portion and the second portion. A height of the second portion gradually decreases along a direction from the central portion toward the edge portion.

According to some embodiments, a heating stage includes a pedestal, a thermal-conductive plate, a supporting shaft, and a through pipe. The pedestal has a first main surface and a second main surface opposite to the first main surface. The thermal-conductive plate is located on the first main surface of the pedestal, wherein the thermal-conductive plate has a central portion and an edge portion surrounding the central portion, and the edge portion comprises a first portion and a second portion connected to the first portion, wherein the first portion is sandwiched between the central portion and the second portion, and a height of the second portion gradually decreases along a direction from the central portion toward the edge portion. The supporting shaft is located on the second main surface of the pedestal, wherein the pedestal is located between the thermal-conductive plate and the supporting shaft. The through pipe is embedded in the supporting shaft.

According to some embodiments, an apparatus for processing a semiconductor wafer includes a chamber including a housing, a shower head, and a heating stage. The housing has a top surface, a bottom surface opposite to the top surface, and a sidewall connecting the top surface and the bottom surface. The shower head is located inside the housing and located on the top surface. The heating stage is at least partially located inside the housing and located on the bottom surface, wherein the heating stage includes a pedestal and a thermal-conductive plate located on the pedestal, wherein the thermal-conductive plate has a central portion and an edge portion surrounding the central portion, and the edge portion includes a first portion and a second portion connected to the first portion, wherein the first portion is sandwiched between the central portion and the second portion, and a height of the second portion gradually decreases along a direction from the central portion toward the edge portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A heating stage, comprising:
   a pedestal, having a first main surface and a second main surface opposite to the first main surface;
   a thermal-conductive plate, located on the first main surface of the pedestal, wherein the thermal-conductive plate has a central portion and an edge portion surrounding the central portion, the edge portion comprises a first portion and a second portion connected to the first portion, wherein the first portion is sandwiched between and in direct contact with the central portion and the second portion, wherein a height of the central portion is constant, a height of the first portion is constant and is greater than the height of the central portion, and a height of the second portion gradually decreases along a direction from the central portion toward the edge portion;
   pins, standing on and evenly distributed over a surface of the central portion of the thermal-conductive plate facing away from the pedestal, wherein the thermal-conductive plate is located between the pedestal and the pins;
   a supporting shaft, located on the second main surface of the pedestal, wherein the pedestal is located between the thermal-conductive plate and the supporting shaft; and
   a through pipe, embedded in the supporting shaft.

2. The heating stage of claim 1, further comprising an angle between an extending plane of a top surface of the first portion and an extending plane of a top surface of the second portion, wherein the angle is in a range of 0.1° to 2.0°.

3. The heating stage of claim 1, wherein the pins are located on the central portion of the thermal-conductive plate in a concentric arrangement or a matrix arrangement.

4. The heating stage of claim 1, further comprising grooves located on the central portion of the thermal-conductive plate, wherein the grooves penetrate a portion of the thermal-conductive plate and spatially communicate with the through pipe.

5. The heating stage of claim 1, wherein the through pipe penetrates through the supporting shaft, the pedestal and the thermal-conductive plate, and the through pipe has a first-end opening and a second-end opening, wherein the first-end opening is at a top surface of the central portion.

6. The heating stage of claim 1, wherein a width of the first portion is less than a width of the second portion.

7. The heating stage of claim 6, wherein a ratio of the width of the first portion to the width of the second portion is approximately in a range of 57.1% to about 60.5%.

8. The heating stage of claim 1, wherein the pins are randomly distributed over and located on the central portion of the thermal-conductive plate.

9. The heating stage of claim 1, wherein a height difference is between a top surface of the central portion and a top surface of the first portion, and wherein a height of the pins is less than the height difference.

10. The heating stage of claim 1, wherein a material of the thermal-conductive plate comprises stainless.

11. An apparatus for processing a semiconductor wafer, comprising:
    a housing, having a top surface, a bottom surface opposite to the top surface, and a sidewall connecting the top surface and the bottom surface;
    a shower head, located inside the housing and located on the top surface; and
    a heating stage, at least partially located inside the housing and located on the bottom surface, wherein the heating stage comprises a pedestal, a thermal-conductive plate located on the pedestal and pins, wherein the thermal-conductive plate has a central portion and an edge portion surrounding the central portion, and the edge portion comprises a first portion and a second portion connected to the first portion, wherein the first portion is sandwiched between and in direct contact with the central portion and the second portion, a height of the central portion is constant, a height of the first portion is constant and is greater than the height of the central portion, and a height of the second portion gradually decreases along a direction from the central portion toward the edge portion, and wherein the pins stand on and are evenly distributed over a surface of the central portion of the thermal-conductive plate facing away from the pedestal, wherein the thermal-conductive plate is located between the pedestal and the pins.

12. The apparatus of claim 11, further comprising an angle between an extending plane of a top surface of the first portion and an extending plane of a top surface of the second portion, wherein the angle is approximately in a range of 0.1° to 2.0°.

13. The apparatus of claim 11, wherein the pins are located on the central portion of the thermal-conductive plate in a concentric arrangement or a matrix arrangement.

14. The apparatus of claim 11, further comprising a through pipe penetrating through the heating stage and having a first-end opening and a second-end opening opposite to the first-end opening, wherein the first-end opening is located inside the housing and at a top surface of the central portion.

15. The apparatus of claim 14, further comprising a gas evacuation device and a gas supply device, wherein the gas evacuation device and the gas supply device are connected to the second-end opening of the through pipe.

16. The apparatus of claim 11, wherein a width of the first portion is less than a width of the second portion.

17. The apparatus of claim 16, wherein a ratio of the width of the first portion to the width of the second portion is approximately in a range of 57.1% to about 60.5%.

18. The apparatus of claim 11, wherein the pins are randomly distributed over and located on the central portion of the thermal-conductive plate.

19. The apparatus of claim 11, wherein a height difference is between a top surface of the central portion and a top surface of the first portion, and wherein a height of the pins is less than the height difference.

20. The apparatus of claim 11, wherein the heating stage further comprises grooves located on the central portion of the thermal-conductive plate, wherein the grooves penetrate a portion of the thermal-conductive plate and spatially communicate with the through pipe.

* * * * *